(12) United States Patent
Bandou et al.

(10) Patent No.: US 6,221,162 B1
(45) Date of Patent: Apr. 24, 2001

(54) APPARATUS FOR FORMING A RESIST LAYER OVER AN ELECTROCONDUCTIVE SUBSTRATE

(75) Inventors: Ryouta Bandou, Yokohama; Shigeki Hozeki, Izumi, both of (JP)

(73) Assignee: Kansai Paint Co., Ltd., Hyogo-Ken (JP)

( * ) Notice: Subject to any disclaimer, the term of this patent is extended or adjusted under 35 U.S.C. 154(b) by 0 days.

(21) Appl. No.: 09/276,919

(22) Filed: Mar. 26, 1999

(30) Foreign Application Priority Data

Mar. 27, 1998 (JP) .................................................. 10-098177
Apr. 27, 1998 (JP) .................................................. 10-130982

(51) Int. Cl.$^7$ .................................................... B05C 1/02
(52) U.S. Cl. .......................... 118/676; 118/686; 118/224; 118/227; 118/236; 118/238; 118/255; 118/262
(58) Field of Search ........................... 118/225–227, 236, 118/238, 241, 255, 262, 424, 425, 428, 500, 673, 675, 676, 677, 686, 224; 427/428, 211, 209, 359, 365

(56) References Cited

U.S. PATENT DOCUMENTS 844,513 * 2/1907 Gill ........................................ 118/424
4,269,138 * 5/1981 Dinella et al. ........................ 118/424

* cited by examiner

*Primary Examiner*—Laura Edwards
(74) *Attorney, Agent, or Firm*—Wenderoth, Lind & Ponack, L.L.P.

(57) ABSTRACT

An apparatus for supplying a liquid resist into a through hole part of an electroconductive substrate comprises an application roll, rotating in a single rotational direction, for coating the electroconductive substrate carried by a carrier with a liquid resist. An opposing member opposed to the application roll enables the electroconductive substrate carried by the carrier to be held. A control unit controls the carrier so that the carrier moves the electroconductive substrate between the application roll and the opposed member in a first carrying direction, and subsequently in a second direction inverse to the first carrying direction.

10 Claims, 2 Drawing Sheets

APPARATUS FOR FORMING A RESIST LAYER OVER AN ELECTROCONDUCTIVE SUBSTRATE

BACKGROUND OF THE INVENTION

1. Field of the Invention

The present invention relates to an apparatus for forming a resist layer over an electroconductive substrate having a through hole part and/or a via hole part (i.e., a non-penetrating hole part).

2. Description of the Prior Art

When manufacturing a printed circuit board having a through hole part and/or a via hole part (hereinafter sometimes referred to as simply "through-hole part") in accordance with the prior art, a liquid resist may be applied by spraying, silkscreening or roller coating. Direct coating of a substrate with a liquid resist by any of these methods would fail to form an adequate resist film within throughholes, resulting in the problem that the interior of the throughholes is partially dissolved by the etching liquid during the etching process to invite defects such as disconnection.

In view of this problem, to protect the throughhole part from the etching liquid, tenting with a dry film resist or application of a liquid resist after filling the throughhole part with filling ink has come to be commonly used in recent years.

However, tenting does not permit narrowing the land width of throughholes and, moreover, the dry film resist it uses is more expensive than a liquid resist, resulting in the problem of an increased production cost. Filling with ink invites an increase in man-hours spent because it involves, after the filling of through-holes, a step to harden the filling ink, another step to remove by polishing the ink stuck somewhere other than the part of the substrate to be filled, and still another to remove the filling ink as required after the formation of a conductor circuit.

Therefore, the present inventors engaged in earnest research to develop, for the formation of a resist layer over an electroconductive substrate having a throughhole part, a simple and inexpensive apparatus which can protect the throughhole part from the etching liquid without having to use filling ink and which is unaffected by the land width of throughholes. As a result, they have completed the present invention by finding that the aforementioned problems can be solved by successfully pressing a liquid resist into throughholes and obtaining a smooth coat surface by roller applying the photoresist under backward rotation after roller applying it under forward rotation and before the photoresist dries. Coating an electroconductive substrate having a conductor circuit pattern and a through hole part and/or a via hole part with a solder resist or an inter-layer insulating material for built-up substrates results in complete filling of the through hole part and/or a via hole part with the resist. Thus, the formation of a reliable solder resist or an inter-layer insulator film is facilitated.

SUMMARY OF THE INVENTION

Therefore, according to the present invention, there is provided an apparatus for forming a resist layer over an electroconductive substrate having a throughhole part, comprising a carrier, an application roller, an opposed member, and a control unit.

The carrier carries an electroconductive substrate having a throughhole part, the application roll rotates in one rotational direction, and coats the electroconductive substrate carried by the carrier with a liquid resist, and the opposing member is arranged so as to be opposed to the application roll holding in-between the electroconductive substrate carried by the carrier. The control unit controls the carrier so that the electroconductive substrate is carried between the application roll and the opposed member in a first carrying direction. Then, the control unit controls the carrier so that the substrate is carried in a second direction inverse to the first one carrying direction.

DETAILED DESCRIPTION OF THE PREFERRED EMBODIMENTS

Figure 1:
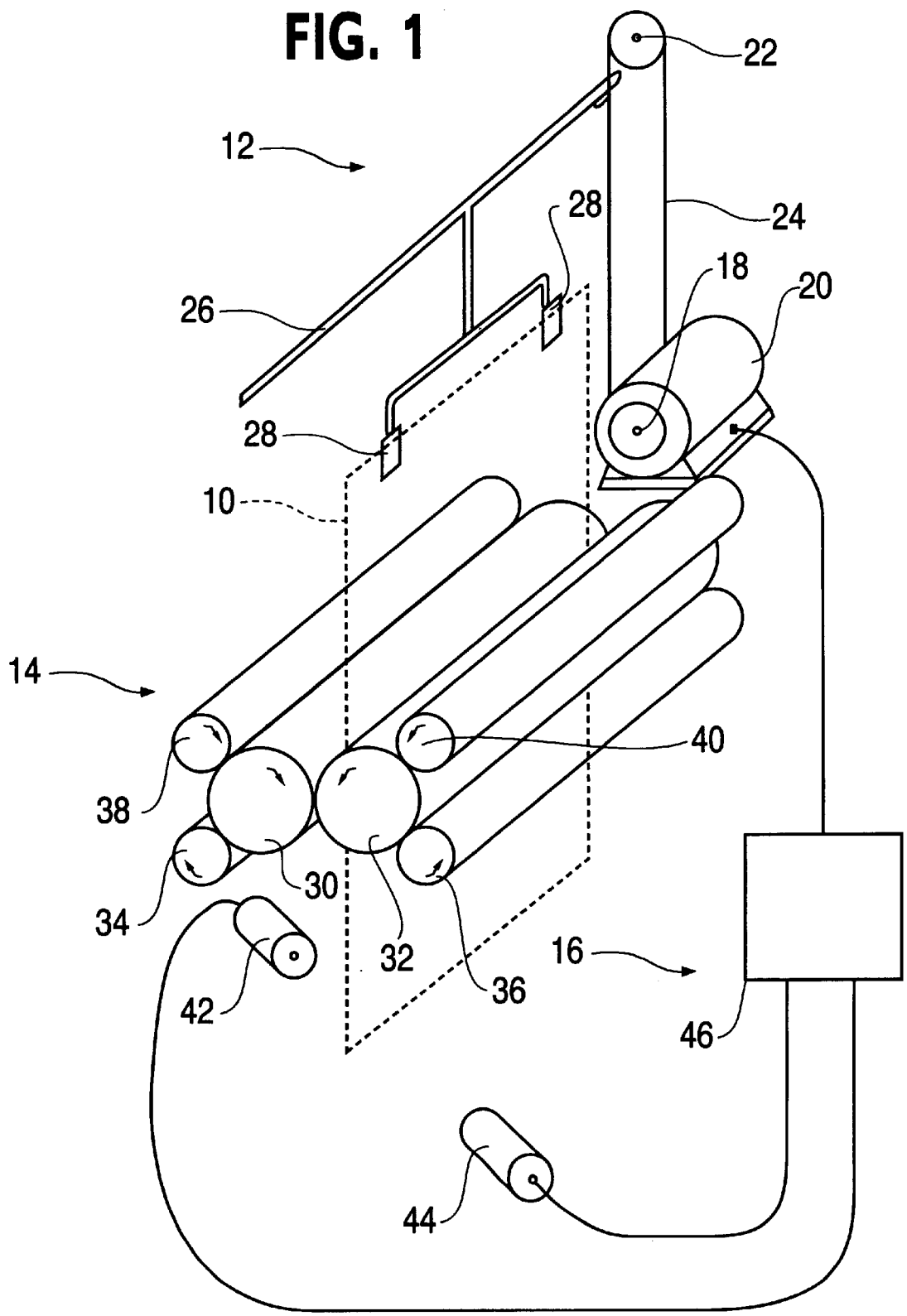
FIG. 1 is a schematic drawing of an apparatus for forming a resist layer over an electroconductive substrate according to one preferred embodiment of the present invention.

Electroconductive substrates having a throughhole part to which an apparatus according to the present invention is applicable include a substrate over the surface and inside the throughhole part of which an electroconductive film is formed. Specific examples include a substrate consisting of a base material of a plastic film or the like, such as an electrically insulating glass-epoxy plate, whose surface is made electroconductive by adhering thereto a metallic foil of copper, aluminum or the like, or forming by vapor deposition or otherwise an electroconductive film of copper or some other metal, or a chemical compound such as an electroconductive oxide typically including an indium-tin oxide (ITO). The substrate has a throughhole part, over whose inside is formed an electroconductive film by copper plating or otherwise. Other examples include a substrate over which an electroconductive circuit pattern is formed by photography or otherwise, or a substrate consisting of a substrate over which a metallic or other electroconductive pattern is formed, and having an insulating resin layer provided over it. Non-penetrating holes are bored into the resin layer by laser machining or by photography, and followed by the formation of an electroconductive film by copper plating or otherwise over the surface of the insulating resin layer including the inside of the non-penetrating holes. A final example includes a substrate over which an electroconductive circuit pattern is formed by photography or otherwise.

The liquid resist to be applied to the substrate having a throughhole part using an apparatus according to the invention may be any liquid resist applicable to the formation of a printed circuit board. Any of a negative photoresist, a positive photoresist, a solder resist, an inter-layer insulator and the like may be used.

When the liquid resist is applied using an apparatus according to the invention, the liquid resist is once pressed into throughholes and between fine wire circuit patterns while being applied by the forward rotating roll, but the rotation of the roll lifts the coat and forces it out of the throughholes. However, when the liquid resist is again applied by the backward rotating roll, the rotation of this roll is in a direction so as to press the liquid resist into the throughholes and between the fine wire circuit patterns. Accordingly, the liquid resist is pressed into these small areas. This roll coater may be a known type in which two application rolls are arranged opposite to each other and allow both faces to be coated at the same time. In this manner, a resist layer can be formed over a substrate having a throughhole part.

Also two application rolls can be arranged opposite to each other to make possible simultaneous coating of both faces.

To fabricate a printed circuit board, a resist pattern is formed by exposing and developing a resist layer, formed over a substrate having a throughhole part using an apparatus according to the invention, followed if necessary by etching and the removal of the remaining part of the resist layer.

In forming an inter-layer insulating layer for a built-up substrate, the insulating material may be either photocuring or thermosetting. If the latter is used, non-penetrating holes can be formed by laser machining or otherwise.

A method of fabricating a printed circuit board from a substrate having a resist layer formed with an apparatus according to the present invention will be described below.

The resist layer of a substrate having a throughhole part, prepared with a resist layer forming apparatus according to the invention, is exposed to an active light ray and developed to form a resist pattern on the substrate. Methods for exposure to the active light ray in a pattern include, for instance, irradiation with the active light ray through a negative or positive photomask and direct drawing by laser scanning.

Active light rays available for use in exposure include ultraviolet rays, visible rays and laser beams (for example visible light laser and ultraviolet laser), and the suitable radiation dose ranges from 0.5 to 2000 $mj/cm^2$, or preferably 1 to 1000 $mj/cm^2$. Sources of the active light ray can include those conventionally used for photo-radiation of photocuring resists, including an ultra-high-pressure mercury-vapor lamp, a high-pressure mercury-vapor lamp, an argon laser and an excimer laser.

Where the resist layer is a negative type, the exposed portion is hardened by the exposure, and the unexposed portion is removed by development. Where the resist layer is a positive type, the exposed portion is made more soluble in the developer by decomposition or ionization, and is removed by development.

Development can be accomplished by immersing the exposed resist in a developer suitable for the particular type of resist, such as an acid developer, alkali developer, water or an organic solvent, or spraying the resist with one or another of these developers and thereby washing the resist. The developing conditions, though not specifically limited, should preferably be between 15 and 40° C. and between 15 seconds and 5 minutes.

The substrate on which the resist pattern, obtained as described above, has been formed is subjected as required to etching of the electroconductive film in the exposed portion where no resist pattern is formed, and a circuit pattern is thereby formed. This etching can be accomplished with an etching liquid selected according to the type of the electroconductive film formed over the substrate. If the electroconductive film is of copper, an acid etching liquid, such as cupric chloride, or an ammonia-based etching liquid can be used. This etching can remove the part of the electroconductive film exposed by the development. Since the resist layer is sufficiently formed within the throughhole part as well according to the invention, copper within the throughhole part is not dissolved during the etching process and accordingly no disconnection will occur.

After the above-described etching process, the remaining part of the resist layer is removed as required. The removal of the remaining part of the resist film is accomplished by using a solvent which dissolves the resist film but exerts no substantial effect on the substrate or on the electroconductive film which keeps the circuit pattern on the substrate surface. For instance, an aqueous solution of alkali or acid or one of various organic solvents can be used.

A printed circuit board having a throughhole part can be obtained as described above.

Embodiments

Next will be described an apparatus for forming a resist layer over an electroconductive substrate, which conforms to a preferred embodiment of the present invention, with reference to FIG. 1.

This apparatus comprises a carrier 12 for holding and moving up and down an electroconductive substrate 10 having a throughhole part (hereinafter sometimes referred to as simply "electroconductive substrate"), a roll coater 14 for applying a liquid resist onto the electroconductive substrate 10, and a control unit 16 for controlling the operation of the carrier 12.

The carrier 12 comprises a drive motor unit 20 having a chain gear 18, an idle gear 22, a chain 24 linked to the chain gear 18 of the drive motor unit 20 and to the idle gear 22, and a hanger 26 connected to the chain 24.

The drive motor unit 20 is rotated in the forward and backward directions by the control unit 16 as will be described below. The chain gear 18 is thereby rotated in the forward and backward directions to turn the chain 24 in the forward and backward directions to raise and lower the hanger 26.

The hanger 26 is provided with a pair of grabs 28 to grab the electroconductive substrate 10.

The roll coater 14 comprises first and second application rollers 30 and 32 for holding the electroconductive substrate 10 between them and coating both faces of the electroconductive substrate 10 with a liquid resist. First and second pickup rollers 34 and 36, respectively, supply the first and second application rollers 30 and 32 with the liquid resist. First and second doctor rollers 38 and 40 adjust the quantities of the liquid resist on the first and second application rollers 30 and 32. It is also possible to configure the arrangement without the first and second pickup rollers 34 and 36 so that the liquid resist is supplied between the first and second application rollers 30 and 32 on the one hand and the first and second doctor rollers 38 and 40, respectively, on the other.

In this embodiment, the second application roller 32 acts as an opposing member to the first application roller 30, and vice versa, so that both faces of the electroconductive substrate 10 are coated with the liquid resist simultaneously. It is also possible to configure the arrangement instead to dispose as the opposing member to the first application roller 30 a backup roll that does not apply the liquid resist. Thus, one face of the electroconductive substrate 10 is coated with the liquid resist, and then the electroconductive substrate 10 is inverted to coat the other face of the electroconductive substrate 10 with the liquid resist.

The control unit 16 comprises sensors 42 and 44 and a controller 46. One of the sensors 42 and 44 may be a light emitting element and the other, a light receiving element, for instance. They detect the arrival of the lower end of the electroconductive substrate 10 between these sensors 42 and 44 when it comes down, and send a signal indicating the detection of the arrival to the controller 46. Upon receiving the detection signal, the controller 46 inverts the rotating direction of the drive motor unit 20.

This resist layer forming apparatus, as it is configured as described above, operates in the following way.

First the electroconductive substrate 10 is caused, either manually or automatically, to be grabbed by the grabs 28 of the hanger 26.

Figure 2:
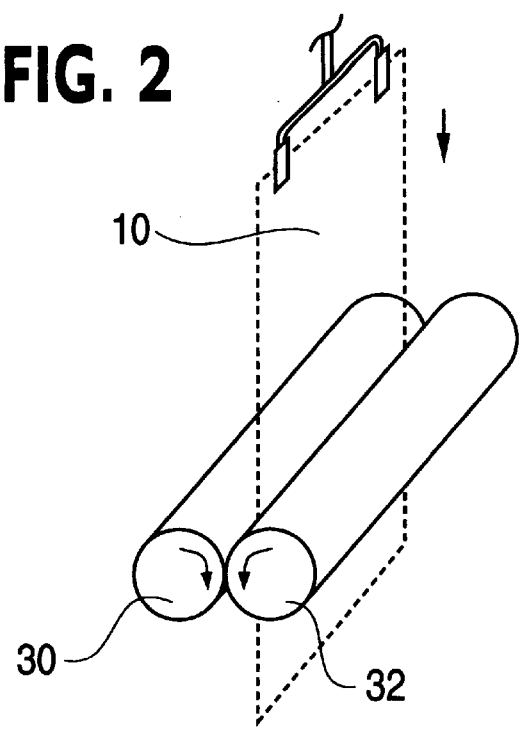
FIG. 2 is a diagram illustrating the mode in which coating under forward rotation is accomplished with the apparatus shown in FIG. 1.

The lower end of the electroconductive substrate 10 is arranged above the first and second application rollers 30 and 32. The electroconductive substrate 10 is lowered by the carrier 12, with its lower end held between the first and second application rollers 30 and 32, and is further lowered. this time, as illustrated in FIG. 2, the direction in which the faces of the first and second application rollers 30 and 32 in contact with the electroconductive substrate 10 move is the same as the moving direction of the electroconductive substrate 10. This enables rotation and coating in the forward direction to be accomplished.

Figure 3:
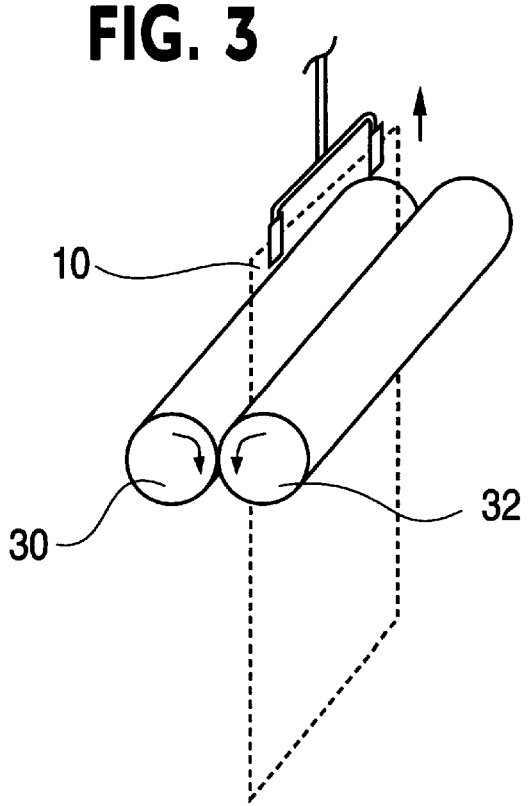
FIG. 3 is a diagram illustrating the mode in which coating under backward rotation is accomplished with the apparatus shown in FIG. 1.

As the electroconductive substrate 10 comes further down, the sensors 42 and 44 in the meantime detect the arrival of the lower end of the electroconductive substrate 10, and send a signal of this detection to the controller 46, which inverts the rotational direction of the drive motor unit 20. The rotational directions of the first and second application rollers 30 and 32 are kept as they have been. At this time, as illustrated in FIG. 3, the direction in which the faces of the first and second application rollers 30 and 32 in contact with the electroconductive substrate 10 move becomes inverse to the moving direction of the electroconductive substrate 10. This enables rotation and coating in the backward direction to be accomplished.

In addition to the above-described embodiment, the present invention has preferred or modified modes of implementation as described below.

Whereas the carrier 12 in the foregoing embodiment comprises a drive motor unit 20, a chain 24 and a hanger 26, a carrier comprising ball screws, or one comprising a linear motor can as well be used. It is also possible to move the electroconductive substrate up and down with a device provided with a drive rod and to drive the rod. It is further possible to use an electric hoist to move the electroconductive substrate up and down.

Fixation of the electroconductive substrate to the carrier can as well be accomplished by boring holes in the electroconductive substrate and fastening it to the hanger with bolts, or by boring holes in the electroconductive substrate and hooking it on projections provided on the hanger. Since the electroconductive substrate is subjected to a force in only one direction in this apparatus, it can be fixed by being hooked onto projections provided on the hanger. It is also possible to connect a cover plate onto the hanger with bolts and squeeze the electroconductive substrate between the cover plate and the hanger by fastening the bolts.

The thicker the application rollers, the greater the uncoatable area of the electroconductive substrate. Therefore, the diameter of the application rollers should desirably be minimized, preferably not more than 200 mm and more preferably not more than 150 mm. However, if the application rollers are rubber rollers, their diameter should preferably be 20 mm or more in view of their possible flexure during the coating process.

The rubber material to be used where the application rollers are to be rubber rollers may be any kind of rubber insoluble in a solvent, but it should preferably be as soft as possible to be readily admissible into holes. However, if it is too soft, there will arise a durability problem. Accordingly the Shore hardness should be 5 to 100, preferably 8 to 70, or more preferably 10 to 50. The usable types of rubber include butyl rubber, EPT and EPDM.

The vertical moving speed of the electroconductive substrate in the roller coater device is variable with the size of the electroconductive substrate and the production volume, and may be, for example, between 0.5 and 20 m/min.

The surface speed of the application rollers should preferably be higher than the carrying speed of the electroconductive substrate by 0 to 500%, preferably by 0 to 200%.

The pressure between the application rollers when the electroconductive substrate is held between them, which is adjusted according to the desired thickness of the resist film, is usually between 1 to 30 kg/cm$^2$.

As hitherto described, by using an apparatus according to the present invention, it is possible to form a resist film which has a sufficient thickness even within throughholes and between fine line circuit patterns by coating an electroconductive substrate having a throughhole part under forward rotation followed by coating under backward rotation. In particular, coating again under backward rotation makes it possible to fully press the liquid resist into the throughholes and between the fine line circuit patterns, and accordingly to form a satisfactory resist film.

An apparatus according to the invention makes possible formation of a resist film which has a sufficient thickness even within throughholes without having to use filling ink, and accordingly contributes to reducing the process length. Compared with an apparatus involving the tenting of a dry film resist, it has a cost advantage because it uses a liquid resist instead of a dry film resist. Moreover, unlike the tenting of a dry film resist which entails difficulty in narrowing the land width, an apparatus according to the invention can also be applied where the land width is narrow.

Furthermore, by using an apparatus according to the invention, the inside of through holes and via holes and the spaces in fine line circuit patterns can be fully filled with a resist. Accordingly a solder resist and an inter-layer insulating film which are electrically insulating and highly resistant to chemicals can be readily formed.

In a printed circuit board having a throughhole part, obtained from a substrate over which a resist film has been formed by an apparatus according to the invention, the electroconductive film within the throughhole part is protected by the resist film from dissolution. Therefore a printed circuit board having satisfactory throughholes, free from disconnection on the circuit and even in the throughholes, can be obtained.

An apparatus according to the invention, which performs coating under both forward and backward rotation with a single application roller, can be made compact in configuration.

Furthermore, an apparatus according to the invention can be suitable for incorporation into an automatic production line by making the electroconductive substrate automatically attachable to and detachable from a hanger.

What is claimed is:

1. An apparatus for forming a resist layer on a substrate, comprising:

a carrier for moving a substrate;

an application roller for contacting and coating the substrate moved by said carrier with a liquid resist, said application roller being adapted to rotate in a single direction;

an opposing member opposing said application roller such that the substrate moved by said carrier is guided between said application roller and said opposing member; and a control unit for controlling said carrier such that said carrier moves the substrate between said application roller and said opposing member in a first direction, and subsequently moves the substrate between said application roller and said opposing member in a second direction inverse to said first direction, wherein a face of said application roller contacting the substrate rotates in a direction corresponding to said first direction when the substrate is moved in said first direction by said carrier, and wherein said face of said application roller contacting the substrate rotates in a direction corresponding to said first direction when the substrate is moved in said second direction by said carrier.

2. The apparatus of claim 1 wherein said application roller comprises a first application roller, and wherein said opposing member comprises a second application roller opposing said first application roller.

3. The apparatus of claim 1 wherein said control unit includes a controller and a sensor for detecting the substrate, said sensor sending a detection signal to said controller when the substrate is detected.

4. The apparatus of claim 3, wherein said carrier includes a drive motor unit and a hanger for holding the substrate, said drive motor unit being adapted to move said hanger in said first direction and in said second direction.

5. The apparatus of claim 4 wherein said drive motor unit is connected to said controller so as to receive a control signal from said controller when said detection signal is received by said controller, said drive motor unit being adapted to switch a movement of said hanger from said first direction to said second direction when said control signal is received.

6. The apparatus of claim 1, wherein said carrier includes a drive motor unit and a hanger for holding the substrate, said drive motor unit being adapted to move said hanger in said first direction and in said second direction.

7. The apparatus of claim 1, wherein a diameter of said application roller is less than or equal to 200 mm.

8. The apparatus of claim 1, wherein said application roller comprises a rubber roller.

9. The apparatus of claim 8, wherein a diameter of said rubber roller is at least 20 mm.

10. The apparatus of claim 8, wherein said rubber roller is formed of a rubber material having a Shore hardness of 5 to 100.

\* \* \* \* \*